(12) United States Patent
Ozawa et al.

(10) Patent No.: US 10,612,127 B2
(45) Date of Patent: Apr. 7, 2020

(54) TARGET MATERIAL FOR SPUTTERING AND METHOD FOR MANUFACTURING SAME

(71) Applicant: MITSUI MINING & SMELTING CO., LTD., Tokyo (JP)

(72) Inventors: Makoto Ozawa, Tokyo (JP); Isao Ando, Tokyo (JP)

(73) Assignee: MITSUI MINING & SMELTING CO., LTD., Tokyo (JP)

(*) Notice: Subject to any disclaimer, the term of this patent is extended or adjusted under 35 U.S.C. 154(b) by 474 days.

(21) Appl. No.: 15/321,863

(22) PCT Filed: Jun. 25, 2015

(86) PCT No.: PCT/JP2015/068383
§ 371 (c)(1),
(2) Date: Dec. 23, 2016

(87) PCT Pub. No.: WO2016/002633
PCT Pub. Date: Jan. 7, 2016

(65) Prior Publication Data
US 2017/0130328 A1 May 11, 2017

(30) Foreign Application Priority Data

Jul. 3, 2014 (JP) ................. 2014-137716

(51) Int. Cl.
| C23C 14/34 | (2006.01) |
| C04B 41/80 | (2006.01) |
| C04B 37/02 | (2006.01) |
| H01J 37/34 | (2006.01) |
| C04B 35/457 | (2006.01) |

(52) U.S. Cl.
CPC ........ C23C 14/3407 (2013.01); C04B 35/457 (2013.01); C04B 37/021 (2013.01);
(Continued)

(58) Field of Classification Search
CPC .................................. H01J 37/3414
See application file for complete search history.

(56) References Cited

U.S. PATENT DOCUMENTS 5,630,918 A * 5/1997 Takahara ............... C04B 35/457
204/192.29
6,153,315 A * 11/2000 Yamakoshi ......... C23C 14/3407
428/687
(Continued)

FOREIGN PATENT DOCUMENTS

JP H 8-060352 A 3/1996
JP 11-61395 A 3/1999
(Continued)

OTHER PUBLICATIONS

International Search Report dated Sep. 1, 2015, from the corresponding PCT/JP2015/068383.
(Continued)

*Primary Examiner* — Jason Berman
(74) *Attorney, Agent, or Firm* — Katten Muchin Rosenman LLP

(57) ABSTRACT

Provided is a sputtering target having extremely low occurrence of arcing or nodules, and a method for manufacturing such a sputtering target. A flat plate-shaped or cylindrical target material (3, 13) is obtained by processing a material composed of an oxide sintered body. In doing so, a grindstone having a specified grade is used to perform rough grinding of a surface of the material that will become a sputtering surface (5, 15) one or more times in accordance to the grade of the grindstone, after which zero grinding is performed one or more times so that the surface roughness of the sputtering surface (5, 15) has an arithmetic mean roughness Ra of 0.9 μm or more, a maximum height Rz of 10.0 μm or less, and $Rz_{JIS}$ roughness of 7.0 μm or less. A sputtering target (1, 11) is obtained by bonding the obtained target material (3, 13) to a backing body (2, 12) by way of a bonding layer (4, 14).

11 Claims, 2 Drawing Sheets

(52) U.S. Cl.
CPC ............ *C04B 37/023* (2013.01); *C04B 41/80* (2013.01); *C23C 14/34* (2013.01); *C23C 14/3414* (2013.01); *H01J 37/3423* (2013.01); *H01J 37/3426* (2013.01); *H01J 37/3429* (2013.01); *H01J 37/3491* (2013.01); *C04B 2235/3286* (2013.01); *C04B 2235/3293* (2013.01); *C04B 2237/12* (2013.01); *C04B 2237/34* (2013.01); *C04B 2237/402* (2013.01); *C04B 2237/403* (2013.01); *C04B 2237/406* (2013.01); *C04B 2237/407* (2013.01); *C04B 2237/52* (2013.01)

(56) References Cited

U.S. PATENT DOCUMENTS

| | | | |
|---|---|---|---|
| 2004/0074770 A1* | 4/2004 | Wityak | B65G 3/00 204/298.14 |
| 2011/0048935 A1 | 3/2011 | Koide | |
| 2014/0251801 A1 | 9/2014 | Zhang et al. | |

FOREIGN PATENT DOCUMENTS

| | | | |
|---|---|---|---|
| JP | 2000345326 A | 12/2000 | |
| JP | 2001-316808 A | 11/2001 | |
| JP | 2004315931 A | 11/2004 | |
| JP | 2005-36268 A | 2/2005 | |
| JP | 2011-179056 A | 9/2011 | |
| JP | 2013-95965 A | 5/2013 | |

OTHER PUBLICATIONS

Supplemental European Search Report dated Jan. 29, 2018, from the corresponding EP15814242.

\* cited by examiner

TARGET MATERIAL FOR SPUTTERING AND METHOD FOR MANUFACTURING SAME

TECHNICAL FIELD

The present invention relates to a target material for sputtering and to a method for manufacturing that material. Furthermore, the present invention relates to a sputtering target that uses this target material for sputtering, and particularly to a segmented sputtering target that uses this target material for sputtering as target material segments.

BACKGROUND ART

A transparent conductive film generally has high electrical conductivity and high transmittance in the visible region. Therefore, transparent conductive film is used as a transparent electrode in solar batteries, liquid-crystal display elements, and other light-receiving elements. Transparent conductive film is also used as a transparent heating element for defogging in automobile windows, heat-ray reflective film in building materials, antistatic film, freezing display cases and the like.

For these uses, a transparent conductive film composed of tin oxide that includes antimony or fluorine as a dopant, zinc oxide that includes aluminum or gallium as a dopant, or indium oxide (ITO) that includes tin as a dopant is used. Particularly, transparent conductive film composed of indium oxide (ITO) that includes tin has low resistance and can be formed comparatively easily, so is widely used in industry.

As methods for forming this kind of transparent conductive film, a spraying method, vapor deposition method, ion plating method, sputtering method and the like are known. Particularly, with the sputtering method, it is possible to easily obtain a transparent conductive film having high productivity and high quality, so the sputtering method is widely used in industry.

In the sputtering method, a sputtering target that is formed by bonding a target material as a film formation source material to a backing body by way of a bonding layer is used. This kind of target material has a problem in that nodules are formed on the sputtering surface during electric discharge. These nodules become the cause of abnormal electric discharge (arcing) or the generation of particles, and these abnormalities generate defects such as pinholes in the transparent conductive film that is obtained. Therefore, during the work of film formation, it is necessary to remove nodules from the sputtering surface, because the existence of nodules becomes a large cause of lowered productivity of transparent conductive film. Problems due to nodules can notably appear in sputtering methods that use a segmented target material in which plural target material segments are connected together.

It is known that nodules are generated at the boundary and vicinity of the boundary (boundary area) between the erosion portion and non-erosion portion of the target material, and that surface roughness in the boundary area affects the generation of nodules. Therefore, in order to suppress the generation of nodules, it is necessary to adequately control the surface roughness of the boundary area.

JPH08060352 (A) discloses controlling the surface roughness of a sputtering surface of a flat ITO target material so that the arithmetic mean roughness Ra is 0.8 µm or less and the maximum height Rz is 7.0 µm or less, or so that the 10-point mean roughness $Rz_{JIS}$ is 0.8 µm or less. This target material has a flat, smooth sputtering surface with very little unevenness, so the occurrence of nodules during electric discharge is stably suppressed. However, when performing sputtering using this target material, particles (sputtered particles) that are ejected from the erosion portion adhere to the non-erosion portion, and when the adhered sputtered particles peel off, arcing is generated, and this may generate particles.

In regard to this, JP2004315931 (A) discloses a flat target material made using an oxide sintered body of which the surface roughness of the top surface of the non-erosion portion has an arithmetic mean roughness Ra of 2.0 µm or more, while the surface of the erosion portion is flat and smooth. With this target material, an anchor effect suppresses peeling of the sputtered particles that adhere to the non-erosion portion, and prevents the occurrence of arcing due to the peeling of the sputtered particles. However, with this target material, there is a possibility that arcing will occur with the protruding sections of the nodules which are formed by sputtered particles deposited in projecting shape on the non-erosion portions as starting points.

RELATED LITERATURE

Patent Literature

[Patent Literature 1] JPH08060352 (A)
[Patent Literature 2] JP2004315931 (A)

SUMMARY OF INVENTION

Problem to be Solved by Invention

An object of the present invention is to provide a sputtering target having very little occurrence of arcing and nodules. Moreover, another object of the present invention is to provide a manufacturing method that is capable of efficiently mass producing this kind of sputtering target.

Means for Solving Problems

The present invention is a target material for sputtering composed of an oxide sintered body and having a sputtering surface, the surface roughness of the sputtering surface having an arithmetic mean roughness Ra of 0.9 µm or more, a maximum height Rz of 10.0 µm or less, and a 10-point mean roughness $Rz_{JIS}$ of 7.0 µm or less.

Preferably, the arithmetic mean roughness Ra is within the range 0.9 µm to 1.5 µm, and more preferably within the range 0.95 µm to 1.2 µm. Moreover, preferably, the maximum height Rz is within the range 5.0 µm to 10.0 µm, and more preferably within the range 6.0 µm to 8.0 µm. Furthermore, preferably, the 10-point mean roughness $Rz_{JIS}$ is within the range 4.0 µm to 7.0 µm, and more preferably within the range 4.5 µm to 6.5 µm.

The manufacturing method for a target material for sputtering of the present invention includes a processing process of obtaining a target material for sputtering by processing a material that is composed of an oxide sintered body; wherein in the processing process, rough grinding using a grindstone having a specified grade is performed on a surface of the target material for sputtering of the material that will become the sputtering surface, after which zero grinding is performed so that the surface roughness of the sputtering surface has an arithmetic mean roughness Ra of 0.9 µm or more, a maximum height Rz of 10.0 µm or less, and a 10-point mean roughness $Rz_{JIS}$ of 7.0 µm or less.

Preferably, rough grinding and zero grinding are performed so that the arithmetic mean roughness Ra is within the range 0.9 µm to 1.5 µm, the maximum height Rz is within the range 5.0 µm to 10.0 µm, and the 10-point mean roughness $Rz_{JIS}$ is within the range 4.0 µm to 7.0 µm.

Preferably, rough grinding is performed using a grindstone having a grade within the range #100 to #170, and the zero grinding is performed using a grindstone having a grade within the range #140 to #400. Preferably, the rough grinding is performed by dividing rough grinding into two to four grindings, and the zero grinding is performed by dividing zero grinding into two to six grindings.

Preferably, after the rough grinding and before the zero grinding, a finish grinding that is divided into one to four grindings is performed using a grindstone having a grade within the range #140 to #400.

The sputtering target of the present invention includes a backing body, and a target material for sputtering that is bonded to the backing body by way of a bonding layer, wherein the target material for sputtering is the target material for sputtering of the present invention.

The present invention can particularly be suitably applied to a segmented sputtering target that includes plural target material segments. Moreover, the present invention can also be applied to a sputtering target that uses either a flat plate-shaped or a cylindrical target material for sputtering, however, particularly can be suitably applied to a cylindrical sputtering target wherein the backing body includes a cylindrical backing tube, and the target material for sputtering has a cylindrical shape.

Furthermore, the manufacturing method for a sputtering target of the present invention includes a bonding process for obtaining a sputtering target by bonding the target material for sputtering of the present invention to a backing body by way of a bonding layer. The present invention can particularly be suitably applied to a manufacturing method for a segmented sputtering target that includes plural target material segments that are arranged adjacent to each other; and in this case, the present invention includes a bonding process of bonding the plural target material segments to a backing tube body so that spacing between end surfaces of adjacent target material segments that face each other is no less than 0.1 mm and no greater than 1.0 mm.

Effect of Invention

With the present invention, a sputtering target is provided that has an extremely low occurrence of arcing or nodules, even in the case of using a segmented sputtering target that include plural target material segments. Moreover, with the present invention, it becomes possible to efficiently mass produce this kind of sputtering target. Therefore, the industrial significance of the present invention is extremely large.

MODES FOR CARRYING OUT INVENTION

As a result of diligent research for solving the problems described above, the inventors came to the conclusion that forming a non-erosion portion such that the surface is somewhat rough is effective in preventing peeling of particles that accumulate in the non-erosion portion of the sputtering target.

However, when grinding the surface of an oxide sintered body using a rough grindstone in order to increase the surface roughness of the non-erosion portion so as to have an arithmetic mean roughness Ra of 2.0 µm or more, the maximum height Rz and the 10-point mean roughness $Rz_{JIS}$ will become too large, and convex or concave sections will exist on the surface of the non-erosion portion. Therefore, it is not possible to prevent the occurrence of nodules that cause these convex sections or concave sections by simply making the arithmetic mean roughness Ra 2.0 µm or greater.

As a result of further researching this point, the inventors obtained knowledge that the occurrence of nodules and the generation of particles and arcing that are caused by nodules can be effectively suppressed by not only regulating the surface roughness of the sputtering surface by the arithmetic mean roughness Ra, but also by the maximum height Rz and the 10-point mean roughness $Rz_{JIS}$. Moreover, the inventors learned that by performing a combination of rough grinding and zero grinding, or a combination of rough grinding, finish grinding and zero grinding, it is possible to easily and efficiently obtain this kind of sputtering surface even in production on an industrial scale.

Figure 1:
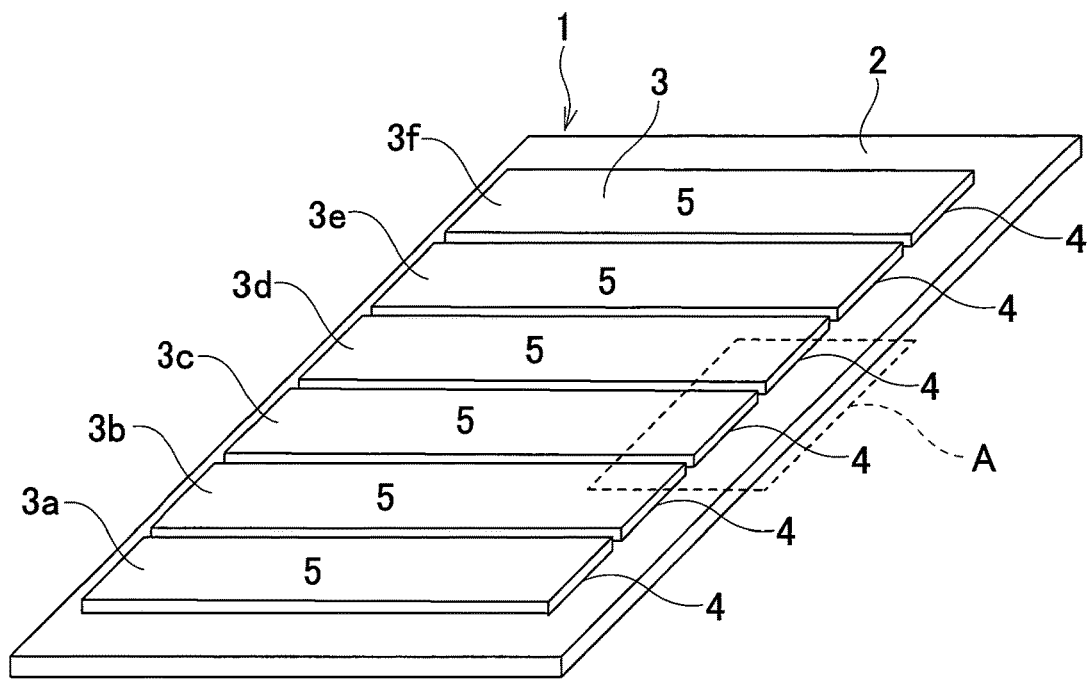
FIG. 1 is a perspective view illustrating a flat plate-shaped sputtering target to which the present invention is applied.
Figure 2:
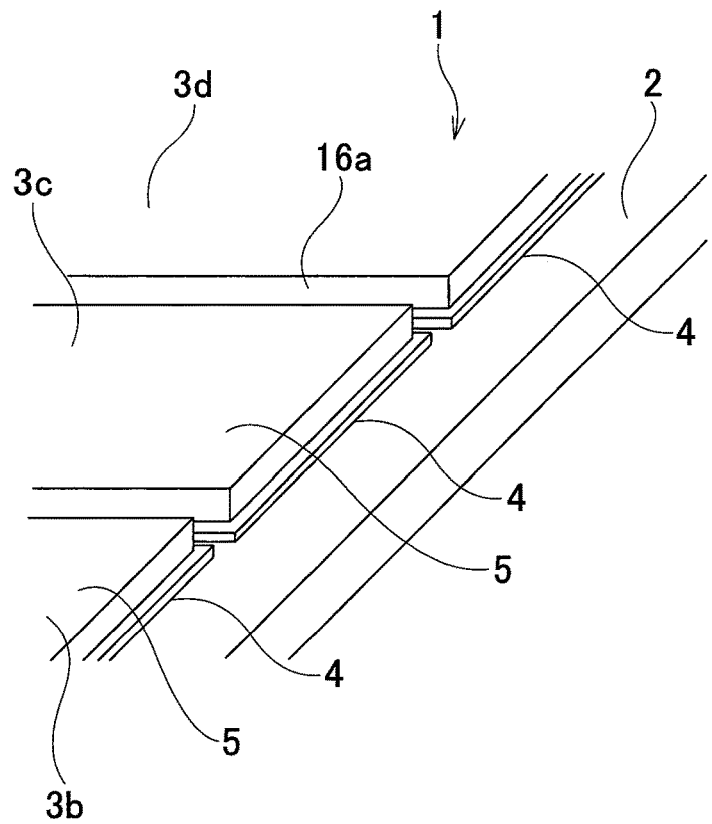
FIG. 2 is an enlarged view of part A in FIG. 1.
Figure 3:
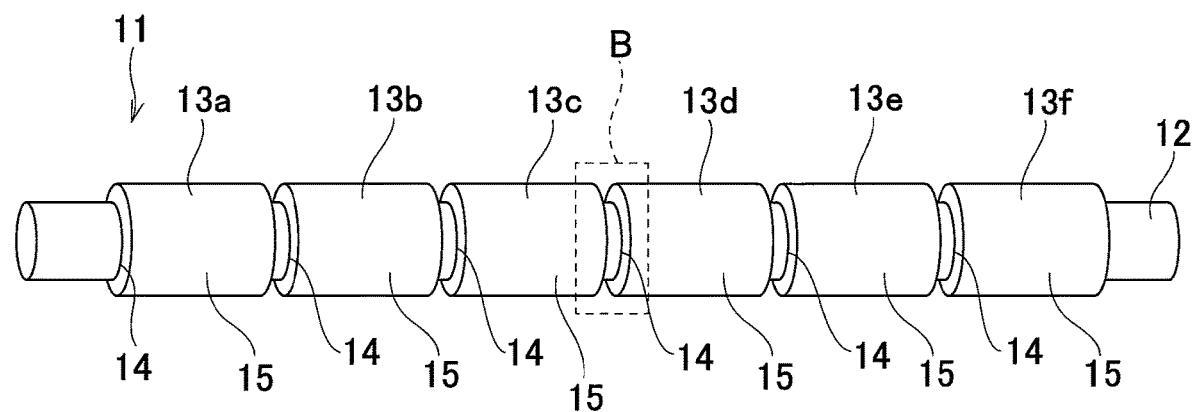
FIG. 3 is a perspective view illustrating a cylindrical sputtering target to which the present invention is applied.
Figure 4:
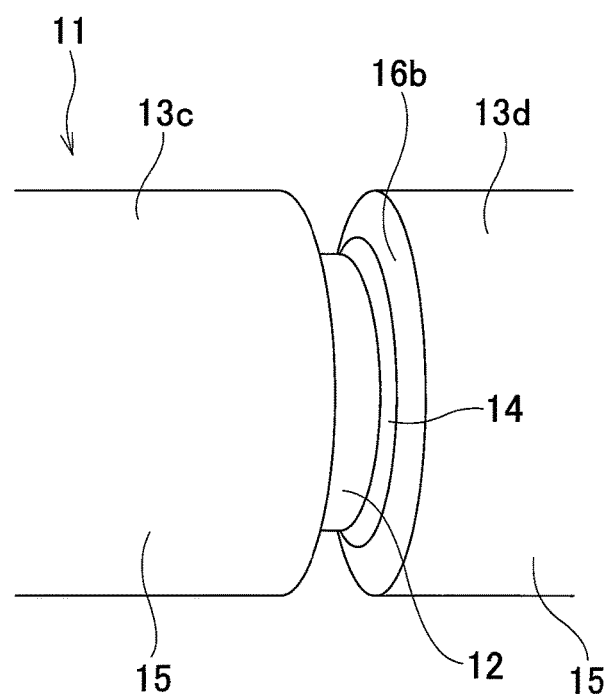
FIG. 4 is an enlarged view of part B in FIG. 3

The present invention was achieved based on this knowledge. The present invention will be explained in detail below with reference to FIG. 1 to FIG. 4, and by dividing the explanation into: "1. Target Material for Sputtering"; "2. Manufacturing Method for a Target Material for Sputtering"; "3. Sputtering Target"; and "4. Manufacturing Method for a Sputtering Target".

1. Target Material for Sputtering a) Material

The object of the present invention is a target material (3, 13) for sputtering (hereinafter, referred to as a "target material") that is composed of an oxide sintered body. A target material composed of an oxide sintered body, when compared with a target material that is made of a metal that includes an alloy, is generally characterized by being able to obtain a transparent conductive film that has little change over time in the resistance value and transmittance, and controlling the film formation conditions is easy; however, nodules are easily generated during sputtering.

In the present invention, the type of oxide sintered body that is used is not particularly limited, and it is possible to use an oxide sintered body, the main component of which is at least one kind selected from among indium (In), tin (Sn), zinc (Zn), aluminum (Al), niobium (Nb), tantalum (Ta), and titanium (Ti). Particularly, an oxide sintered body having indium oxide ($In_2O_3$) or zinc oxide (ZnO) that are easily adaptable to a binding material having a low melting point can be suitably used.

More specifically, the present invention can be suitably applied to an oxide sintered body that is composed of indium oxide (ITO) that includes tin, indium oxide (ICO) that includes cerium (Ce), indium oxide (IGO) that includes gallium (Ga), indium oxide (ITiO) that includes titanium, indium oxide (IWO) that includes tungsten (W), indium oxide (IYO) that includes yttrium (Y), indium oxide (INiO) that includes nickel (Ni), indium oxide (IScO) that includes scandium (Sc), indium oxide (ISiO) that includes silicon (Si), indium oxide (IGeO) that includes germanium (Ge), indium oxide (IHfO) that includes hafnium (Hf), indium oxide (ITaO) that includes tantalum (Ta), indium oxide (IFeO) that includes iron (Fe), indium oxide (IPrO) that includes praseodymium (Pr), indium oxide (IEuO) that includes europium (Eu), indium oxide (IErO) that includes erbium (Er), indium oxide (IDyO) that includes dysprosium (Dy), indium oxide (IMnO) that includes manganese (Mn), indium oxide (ICoO) that includes cobalt (Co), indium oxide (IMgO) that includes magnesium (Mg), indium oxide (IZO) that includes zinc (Zn), or indium oxide that includes gallium and zinc (IGZO). Moreover, the present invention can also be suitably applied to an oxide sintered body that is composed of zinc oxide (AZO) that includes aluminum, zinc oxide (GZO) that includes gallium, zinc oxide (GZO) that includes gallium, zinc oxide (ZIO) that includes indium, zinc oxide (ZMgO) that includes magnesium oxide (MgO), zinc oxide (ZTO) that includes tin oxide ($SnO_2$), zinc oxide (GAZO) that includes gallium and aluminum, or tin oxide (TZO) that includes zinc oxide (ZnO).

b) Shape

The present invention is not limited by the shape of the target material (3, 13), and can be applied to both a flat target material (3) and a cylindrical target material (13). Moreover, the present invention is not limited by the size of the target material (3, 13), and can be applied to various sizes of target materials (3, 13).

When performing film formation on glass having a large area that exceeds 12000 cm$^2$ (100 cm×120 cm) or a film that has a width that exceeds 50 cm, generally a segmented sputtering target (1, 11) that is constructed by bonding together plural target material segments (3a to 3f, 13a, to 13f) to a backing body (2, 12) by way of respective bonding layers (4, 14) so as to be arranged adjacent to each other is used, however, the present invention can also be suitably applied to a segmented target material (3, 13) that is used in a segmented sputtering target (1, 11).

c) Surface Roughness of the Sputtering Surface

Of the target materials (3, 13) of the present invention, for both a flat plate-shaped target material (3) and a cylindrical target material (13), the surface roughness of the sputtering of the sputtering surface (5, 15) is such that the arithmetic mean roughness Ra is 0.9 μm or more, the maximum height Rz is 10.0 μm or less, and the 10-point mean roughness $Rz_{JIS}$ is 7.0 μm or less.

With a target material (3, 13) having this kind of surface roughness, peeling of sputtered particles that have adhered to and accumulated in the non-erosion portion of the sputtering surface (5, 15) due to the anchor effect is effectively prevented. Moreover, sputtered particles do not accumulate in protruding shapes to become nodules in the non-erosion portion, so the occurrence of arcing with such protruding sections as starting points is effectively prevented.

The arithmetic mean roughness Ra, the maximum height Rz and the 10-point mean roughness $Rz_{JIS}$ can be measured using a surface roughness and contour shaft measuring instrument according to a method that complies to JIS B 0601 (2013).

[Arithmetic Mean Roughness Ra]

In the present invention, the arithmetic mean average Ra is controlled so as to be 0.9 μm or more, and preferably 0.95 μm or more. When the arithmetic mean roughness Ra is less then 0.9 μm, the sputtered particles that are caused to fly about during sputtering re-adhere to the sputtering surface (5, 15), particularly the non-erosion portion, and become accumulated matter, and the anchor effect cannot be sufficiently used against this accumulated matter. Therefore, peeling of the accumulated matter causes arcing to occur. The upper limit of the arithmetic mean roughness Ra is essentially limited by controlling the maximum height Rz and the 10-point mean roughness $Rz_{JIS}$, however, preferably is 1.5 μm or less, and more preferably is 1.2 μm or less.

[Maximum Height Rz]

In the present invention, the maximum height Rz is controlled so as to be 10.0 μm or less, and preferably 8.0 μm or less. When the maximum height Rz exceeds 10.0 μm, protruding sections that are comparatively high come into existence on the sputtering surface (5, 15), and during sputtering, arcing occurs due do electric current becoming concentrated at these protruding sections. The lower limit for the maximum height Rz is essentially limited by controlling the arithmetic mean roughness Ra, however, is preferably 5.0 μm or more, and is more preferably 6.0 μm or more.

[10-Point Mean Roughness $Rz_{JIS}$]

In the present invention, the 10-point mean roughness $Rz_{JIS}$ is controlled so as to be 7.0 μm or less, and preferably 6.5 μm or less. When the 10-point mean roughness $Rz_{JIS}$ exceeds 7.0 μm, the anchor effect becomes excessively large, so sputtered particles that adhered to the sputtering surface (5, 15) grow to a protruding shape, and it becomes easy for nodules to occur. The lower limit of the 10-point mean roughness $Rz_{JIS}$ is also essentially limited by controlling the arithmetic mean roughness Ra, however is preferably 4.0 μm or more, and more preferably is 4.5 μm or more.

d) Surface Roughness of Non-sputtering Surfaces

In the present invention, by suitably regulating the surface roughness of the sputtering surface and using the anchor effect, the occurrence of arcing that is caused by peeling of sputtered particles that re-adhere to the sputtering surface, and the occurrence of arcing due to sputtered particles that accumulate on the sputtering surface growing to protruding shapes and becoming nodules, and electric current becoming concentrated at those nodules is effectively prevented. Therefore, the effect that the surface roughness of the side surfaces of a flat plate-shaped target material or that the surface roughness of the end surfaces of a cylindrical target material has on the occurrence of arcing is inherently kept small. Consequently, in the present invention, the surface roughness of these non-sputtering surfaces as a rule is not limited. However, as in the case of the sputtering surface, controlling the surface roughness of non-sputtering surfaces so that the arithmetic mean roughness Ra is 0.9 μm or more, the maximum height Rz is 10.0 μm or less, and the 10-point mean roughness $Rz_{JIS}$ is 7.0 μm or less is possible and preferred.

2. Manufacturing Method for a Target Material for Sputtering

The manufacturing method for a target material of the present invention includes a process of obtaining a target material by processing an oxide sintered body so as to have a specified shape and specified surface roughness. The present invention can be suitably applied to both a target material that is composed of a flat plate-shaped oxide sintered body and a target material that is composed of a cylindrical oxide sintered body.

The top surface of a flat plate-shaped oxide sintered body and the outer-circumferential surface of a cylindrical oxide sintered body will become the sputtering surfaces of the sputtering targets of the present invention. In the manufacturing method for a target material of the present invention, a grinding process is performed on these surfaces that will become the sputtering surfaces using a grindstone having a specified grade. In the present invention, with this grinding process, processing the surface roughness of the sputtering surfaces so that the arithmetic mean roughness Ra is 0.9 μm or more, the maximum height Rz is 10.0 μm or less and the 10-point mean roughness $Rz_{JIS}$ is 7.0 μm or less is important. As this grinding process, rough grinding is performed one time or more and zero grinding is performed one time or more, or, rough grinding is performed one time or more, finish grinding is performed one time or more, and zero grinding is performed one time or more. With this kind of grinding process, making the surface roughness of the sputtering surfaces so as to be within the specified ranges described above can be performed easily and efficiently.

a) Manufacturing Method for a Flat Plate-shaped Target Material

When manufacturing a flat plate-shaped target material, first, a flat-surface grinder is used to perform a grinding process on the top surface of the surfaces of a flat plate-shaped oxide sintered body that will become the sputtering surface. When doing this, at least rough grinding is performed one time or more and zero grinding is performed one time or more on the surface so that the surface roughness, or in other words, the arithmetic mean roughness Ra, maximum height Rz and 10-point mean roughness $Rz_{JIS}$ are within the specified ranges described above. Next, a flat-surface grinder, a slicing machine, a grinding center, a machining center and the like are used to perform a grinding process on the side surfaces and the end surfaces of the flat plate-shaped oxide sintered body. As a result, the dimensions of the flat plate-shaped oxide sintered body are adjusted to specified dimensions. The order of processing the top surface, side surfaces and end surfaces is not particularly limited, and as long as it is possible to control the roughness of the top surface so as to be within the specified range described above, it is also possible to process the top surface after processing the side surfaces and the end surfaces.

b) Manufacturing Method for a Cylindrical Target Material

When manufacturing a cylindrical target material, grinding of the end surfaces of a cylindrical oxide sintered body is performed in order to obtain parallelism. Next, a cylindrical grinder, an inner-surface grinder, a machining center, a grinding center and the like are used to perform a grinding process on the inner-circumferential surface and the outer-circumferential surface of the cylindrical oxide sintered body so that the dimensions become specified dimensions. When doing this, at least rough grinding is performed one time or more and zero grinding is performed one time or more on the outer-circumferential surface of the cylindrical oxide sintered body so that the surface roughness, or more specifically, so that the arithmetic mean roughness Ra, maximum height Rz and the 10-point mean roughness $Rz_{JIS}$ are within the specified ranges described above. After that, a flat-surface grinder is used to perform a grinding process again on the end surfaces so that the overall length of the cylindrical target material becomes a specified dimension.

In the case of a cylindrical oxide sintered body, it may not be possible to secure the body to a chucking jig (fastening jig) with sufficient fastening strength using a known chucking method when performing the processing described above due to peculiarity of the shape or low strength of the body, so there is a possibility that the position of the body will shift or that the body will crack during processing. Therefore, preferably processing is performed after improving the fastening strength by fastening the cylindrical oxide sintered body to the chucking jig using adhesive or the like in addition to using a known chucking method.

c) Processing of a Sputtering Surface

[Rough Grinding]

In rough grinding, grinding is performed using a comparatively coarse grindstone. More specifically, a grindstone having a grade of #100 to #170 is preferably used, and more preferably, a grindstone having a grade of #120 to #170 is used, and even more preferably, a grindstone having a grade of #120 to #140 is used. By using a grindstone having such a comparatively large grit size such as this, it is possible to perform rough grinding with high working efficiency. Moreover, by performing zero grinding or finish grinding, it is possible to easily form a sputtering surface having a specified surface roughness.

When the grindstone has a grade that is less than #100, the maximum height Rz and the 10-point mean roughness $Rz_{JIS}$ of the sputtering surface become too large, so it becomes difficult to suppress the occurrence of arcing or nodules during sputtering. On the other hand, when the grindstone has a grade that is greater than #170, performing rough grinding requires a long time, which brings about a worsening of the productivity. Moreover, the grindstone frequently becomes clogged or glazed, and the grinding resistance becomes large, so there is a possibility that the grinding wheel spindle or oxide sintered body will deform, or that cracking will occur in the oxide sintered body. Furthermore, truing work (work for repairing the deformed grinding wheel spindle) or dressing work (work to restore the cutting quality by sharpening the surface of the grindstone) becomes necessary, which further worsens the productivity.

It also depends on the processing method, however, particularly when performing processing using plunge cutting, processing to a specified dimension by dividing processing into plural grindings is preferred to performing processing to a specified dimension using only one grinding. In other words, in rough grinding, dividing the grinding of one surface into plural grindings is preferred to performing grinding only one time. This is because reducing strain and mechanical overload due to grinding is also an objective, and because typically the grinding surface of the grindstone is much smaller than the surface area of the sputtering surface of the oxide sintered body, problems due to not being able to grind the entire surface of the sputtering surface, which is the surface to be ground, with one grinding occur. In other words, part of the surface to be ground is ground deeply, and large unevenness occurs between the ground portion and unground portion of the surface to be ground. When this kind of uneven portion that is formed on the surface to be ground comes in contact with the end surface of the grindstone, vibration occurs in the grindstone, and it becomes impossible to evenly grind the entire surface to be ground with just one grinding, so in order to avoid this kind of problem, grinding of the sputtering surface is performed by dividing the grinding into plural grindings.

Moreover, by the uneven portion of the surface being ground coming in contact with the side surface of the grindstone, grinding fluid does not flow onto the grinding surface during grinding, which may cause insufficient cooling of the grinding surface resulting in grinding burn, or grinding chips may not be efficiently discharged, which causes the grindstone to become clogged and the grinding speed to decrease. In order that problems such as these do not occur, preferably the amount of grinding performed in one grinding is set in advance.

More specifically, the amount of grinding in one grinding is preferably 2 mm or less, and more preferably 1 mm or less. The lower limit is not particularly limited, however as the number of times grinding is performed increases, the number of times the body is handled increases, so productivity decreases, so preferably the amount of grinding per one grinding is 300 μm or more and more preferably 500 μm or more so that the number of times grinding is performed is about two to four times.

When performing grinding with this kind of grinding amount, in the case of a flat plate-shaped oxide sintered body, when grinding is performed with a grinding amount of 50 μm or more for one grinding, a large load is applied to the oxide sintered body or to the grindstone, and the oxide sintered body may break, the grindstone may wear out quickly or the surface roughness of the surface being ground may become large, so preferably, this grinding is performed by dividing the grinding into plural grindings. In other words, preferably the amount of cutting per one grinding is 30 μm or less, and more preferably 15 μm or less.

On the other hand, in the case of a cylindrical oxide sintered body, the grindstone is not moved back-and-forth as in the case of a flat plate-shaped oxide sintered body, but rather, the oxide sintered body is rotated, which makes it possible to perform grinding in a comparatively short amount of time even with a small cutting amount; and even when the cutting amount per one grinding is large, it is difficult for the oxide sintered body to break or for the surface roughness to become large. Therefore, the amount of cutting per one grinding should be selected from a range of about $\phi$0.01 mm/sec to $\phi$0.20 mm/sec.

[Finish Grinding]

Normally in the grinding process, finish grinding is performed on the surface being grinded after rough grinding has been performed. However, in the present invention, as the surface grinding of the sputtering surface, a grindstone having a specified grade is used, and rough grinding is performed one time or more and zero grinding is performed one time or more, and as long as the sputtering surface is within the specified range described above, it is not necessary to perform finish grinding, so finish grinding is arbitrary. However, from the aspect of forming a comparatively moderate uneven shape over the entire sputtering surface, and similarly, from the aspect of stabilizing the state of the surface and the surface roughness after grinding, and reducing strain and loads on the oxide sintered body that occur during grinding, which is the object of grinding, preferably finish grinding is employed.

In finish grinding, a grindstone having a smaller grade than that in rough grinding is used. Normally, when a grindstone having a grade of #100 to #170 is used in rough grinding, a fine grindstone having a grade of #600 to #800 is used in finish grinding. However, in the present invention, when finish grinding is used as surface grinding of the sputtering surface, then from the aspect of making the surface roughness of the sputtering surface so as to have an arithmetic mean roughness Ra of 0.9 μm, using a grindstone having a grade of #140 to #400 is sufficient. Preferably a grindstone having a grade of #170 to #325 is used.

When a grindstone having a grade that is less than #140 is used for finish grinding, the maximum height Rz and the 10-point mean roughness $Rz_{JIS}$ become to large, so it becomes difficult to suppress the occurrence of arcing and nodules during sputtering. On the other hand, when a grindstone having a grade that is greater than #400 is used, not only does workability become worse, but the arithmetic mean roughness Ra becomes less than 0.9 μm, and it may not be possible for a sufficient anchor effect on the sputtered particles to act on the sputtering surface.

In the present invention, the amount of cutting (feed amount of the grindstone) during finish grinding is also arbitrary, however, in the case of a flat plate-shaped oxide sintered body, normally a cutting amount of 10 μm or less is preferred, and a cutting amount of 1 μm to 5 μm is even more preferred. In the case of a cylindrical oxide sintered body, for the same reason as in the case of rough grinding, a cutting amount of $\phi$0.01 mm/sec to $\phi$0.15 mm/sec is preferred, and a cutting amount of $\phi$0.03 mm/sec to $\phi$0.10 mm/sec is more preferred.

In finish grinding, the load on the oxide sintered body during grinding is smaller than in rough grinding, and there is no particular problem even when the number of grindings is one grinding per surface. However, when the grinding amount of finish grinding is increased, as in the case of rough grinding, the number grindings is preferably two to four grindings. This is because often a fine grindstone having a comparatively large grade is used in finish grinding, and a grindstone having a large grade becomes clogged easily, so it becomes easy for a decrease in grinding performance to occur. Due to this decrease in the grinding performance, grinding burning, chipping and distortion of the grindstone occur, which causes problems such as bending of the sputtering surface to occur. Moreover, in the finishing process, the state is close to the finished state of the surface, so it is important that such problems do not occur, and by increasing the number of times processing is performed and by performing processing while removing distortions, it becomes possible to eliminate these problems. However, when the number of times finish grinding is performed is five times or more, depending on the grinding conditions, not only can the effect no longer be expected, but also work efficiency could worsen and the arithmetic mean roughness Ra of the sputtering surface could become less than 0.9 μm. The grinding amount in one grinding is not particularly limited, however, is selected to be within the range 5 μm to 400 μm depending on the target grinding amount and the number of grindings.

[Zero Grinding]

In the manufacturing method for a target material of the present invention, after finish grinding, or after rough grinding in the case that finish grinding is omitted, zero grinding (spark out) is performed on the top surface of a flat plate-shaped oxide sintered body or on the outer-circumferential surface of a cylindrical oxide sintered body. By doing so, it is possible to remove any protruding sections that remain after finish grinding or after rough grinding. Zero grinding is a processing method in which a processing jig is moved so as to smooth the processed surface, or in other words, the grindstone is rotated so as not to apply any cutting (cutting amount is '0'), then grinding is continued until there are no sparks and no grinding noise and the protruding sections that exist on the processed surface are ground away.

The grindstone that is used in zero grinding is not particularly limited, and it is possible to use as is the grindstone that was used in rough grinding or finish grinding, or it is also possible to use a grindstone having a different grade than these grindstones. However, from the aspect of efficiently removing the remaining protruding matter, preferably a grindstone that has the same grade of #140 to #400 as the grindstone used in finish grinding, and more preferably a grindstone that has a grade of #170 to #325 is used in zero grinding that is performed after finish grinding. In the case of a grindstone that has a grade of less than #140, the maximum height Rz and the 10-point mean roughness $Rz_{JIS}$ of the sputtering surface become too large, and it may become difficult to suppress the occurrence of arcing and nodules during sputtering. On the other hand, in the case of a grindstone having a grade that is greater than #400, a large amount of time is required for zero grinding, which invites a worsening of productivity.

In zero grinding, as in the case of rough grinding, rather than performing grinding only one time per surface, dividing grinding into plural grindings is preferred. More specifically, dividing grinding into two to six grindings per surface is preferred.

3. Sputtering Target

The sputtering target of the present invention, similar to a conventional target, has a backing body, a target material that is bonded to the backing body, and a bonding layer that is between the backing body and the target material. Particularly, a feature of the sputtering target of the present invention is the use of a target material as described above as the target material.

a) Target Material

In the sputtering target (1, 11) of the present invention, a target material (3, 13) described above is used as the target material. It is also possible to use a segmented target material in which plural target material segments (3a to 3f, 13a to 13f) are connected together.

[Segmented Target Material]

As described above, nodules often occur at and in the proximity of the boundary (boundary area) between an erosion portion and non-erosion portion. More specifically, in the case of a flat plate-shaped sputtering target (1), there is a boundary between an erosion portion and non-erosion portion on the outer perimeter, and in the case of a cylindrical sputtering target (11), there is a boundary between an erosion portion and non-erosion portion on both end sections, so nodules often occur at and in the proximity of these boundaries (boundary areas). However, in the case of a segmented target material (3, 13) in which plural target material segments (3a to 3f, 13a to 13f) are connected together, nodules also occur not only at the boundary areas described above, but also at and in the proximity of the dividing sections between segments. Therefore, as the number of segments increases, the frequency of the occurrence of nodules also increases.

Therefore, when the present invention is applied to a segmented target (3, 13) such as this, it becomes possible to greatly suppress the occurrence of arcing and nodules by the function described above regardless of the number of segments.

[Segment Spacing]

When applying the present invention to a segmented target material (3, 13), the spacing between the side surfaces (6) of adjacent target material segments (3a to 3f, 13a to 13f) that face each other (hereinafter, referred to as "segment spacing") is preferably no less than 0.1 mm and no greater than 1.0 mm, and more preferably no less than 0.3 mm and no greater than 0.6 mm. When the segment spacing is less than 0.1 mm, there is a possibility that adjacent target material segments (3a to 3f, 13a to 13f) will come in contact with each other due to thermal expansion during film formation, and cracking will occur in the target material segments, which may cause arcing and nodules to occur with the cracks as starting points. On the other hand, when the segment spacing is greater than 1.0 mm, impurities that exist between adjacent target material segments (3a to 3f, 13a to 13f) may get caught inside the film that is being formed on the sputtering target (1, 11), and it will become easy for arcing and nodules to occur due to electric current concentrating at protruding sections that exist on the side surfaces (6) or end surfaces (16).

In conventional technology, preferably the segment spacing was about 0.1 mm to 0.5 mm, however, in the case of production on an industrial scale, it is not easy to control the segment spacing to be within such a range as this, which brings about a worsening of the work efficiency. In regard to this point, with the present invention, it is possible to sufficiently suppress the occurrence of arcing and nodules even when the segment spacing is greater than 0.5 mm and up to about 1.0 mm, so it is possible to improve the working efficiency.

b) Backing Body

[Material]

In the sputtering target (1, 11) of the present invention, the material of the backing body (2, 12), or in other words, the material of a backing plate (2) and backing tube (12) is not particularly limited, and a known material can be used. For example, in addition to a backing body that is made using a typical austenitic stainless steel such as SUS304, it is also possible to use a backing body that is made using copper or copper alloy, titanium or titanium alloy, molybdenum or molybdenum alloy, or aluminum or aluminum alloy. However, of these, there are materials that have a passive film or oxide film on the surface thereof and have inferior ability to bond with a bonding material. When using such a backing body, it is preferred that a metal layer such as copper and/or nickel be formed on the surface thereof.

[Shape]

When the present invention is applied to a flat plate-shaped sputtering target (1), the shape of the backing plate (2) is not particularly limited as long as the flat plate-shaped target material (3) does not protrude when bonded. Moreover, the thickness of the backing plate (2) is not particularly limited as long as the thickness is such that there is no bending during handling.

When a backing plate (2) is repeatedly used, or when there is a large difference in the coefficient of thermal expansion of the flat plate-shaped target material (3) and the backing plate (2), there is a possibility that bending or warping of the sputtering target (1) will occur. In such a case, it is necessary when bonding the flat plate-shaped target material (3) and backing plate (2) to perform measures for absorbing the bending such as performing bonding while correcting the bending, forming a thick bonding layer (4) by applying a lot of bonding material to the surface of the bonding plate (2), or the like.

On the other hand, when applying the present invention to a cylindrical sputtering target (11), the outer diameter of the backing tube (12) is preferably set taking into consideration the coefficient of linear expansion of the cylindrical target material (13). For example, when using ITO having a coefficient of linear expansion of $7.2 \times 10^{-6}/°$ C. at 20° C. as the cylindrical target material (13) and using SUS304 having a coefficient of linear expansion of $17.3 \times 10^{-6}/°$ C. at 20° C. as the backing tube (12), the outer diameter of the backing tube (12) is set so that the spacing between the inner-circumferential surface of the cylindrical target material (13) and the outer-circumferential surface of the backing tube (12) is preferably 0.3 mm to 2.0 mm, and more preferably 0.5 mm to 1.0 mm. When this spacing is less than 0.3 mm, there is a possibility that the cylindrical target material (13) will break when melted bonding material for forming a bonding layer (14) is injected. On the other hand, when this spacing is greater than 2.0 mm, it becomes difficult to coaxially arrange the backing tube (12) in the hollow section of the cylindrical target material (13) and to form a bond so that these center axes match.

The overall length of the backing tube (12) must also be appropriately selected according to the overall length of the cylindrical target material (13) that will be bonded to the backing tube (12). For example, the overall length of the backing tube (12) is preferably 0 mm to 500 mm longer, and more preferably 10 mm to 200 mm longer than the overall length of the cylindrical target material (13) that is bonded to the backing tube (12). As long as the overall length of the backing tube (12) is within such a range, handling during sputtering becomes easy.

c) Bonding Layer

A bonding layer (4, 14) is formed by hardening of a bonding material that is applied to the surface of the backing plate (2), or by hardening of a bonding material that is injected in the space between the backing tube (12) and cylindrical target (13) when in the combined state.

The bonding material should have a melting point that is lower than that of the backing body (2, 12) and target material (3, 13), and should have sufficient bonding strength. Typically, it is possible to suitably use a low melting point solder that has indium, tin or zinc as the main component. More specifically, it is possible to use a low melting point solder that has indium as the main component and that includes tin, antimony or the like, and it is possible to use a low melting point solder that has tin as the main component and that includes indium, antimony, zinc and the like. These low melting point solders not only have a hardness after cooling and solidification that is within a suitable range, but also have a high degree of flowability when melted, and can be formed into a uniform bonding layer (4, 14) having very few holes or damage.

Particularly, low melting point solder having indium as the main component, and preferably low melting point solder that includes indium at 80% by mass or more, and more preferably 90% by mass or more has a hardness after cooling and solidification that is lower than low melting point solder having tin or zinc as the main component, and can effectively prevent breakage of the target material segments during the cooling process. Moreover, the effect of absorbing impact during sputtering is high, so can be particularly used as a suitable bonding material of a cylindrical sputtering target (11).

4. Manufacturing Method for a Sputtering Target

The manufacturing method for a sputtering target of the present invention includes a bonding process for obtaining a sputtering target by bonding the target material of the present invention to a backing body. The method for bonding the target material and the backing body is not particularly limited and a known method can be applied.

When applying the present invention to a segmented sputtering target that is made using plural target material segments that are adjacently arranged, bonding is preferably performed so that the spacing between the end surfaces of adjacent target material segments that face each other becomes no less than 0.1 mm and no greater than 1.0 mm as described above.

EXAMPLES

The present invention will be explained in further detail using examples and comparative examples. In the examples and comparative examples, sputtering is performed using the obtained sputtering targets, and arcing and nodules that occur during sputtering are evaluated according to standards described below.

[Arcing Evaluation]

Arcing evaluation is performed by taking the detection time for high-speed arcs and low-speed arcs to be 0, and counting the number of times that arcing occurs per 10 minutes after one hour has elapsed from the start of sputtering. Arcing evaluation is divided into three times (initial period, intermediate period and final period), and during each evaluation, arcing was evaluated as: "excellent" when the number of times that arcing occurred was less than 20, "good" when the number of times was 20 or greater but less than 50, "passable" when the number of times was 50 or greater, and "bad" when the occurrence of large arcing on a visible scale could be confirmed.

[Nodule Evaluation]

Nodule evaluation was performed by visually observing the sputtering surface and dividing sections (side surfaces or end surfaces). More specifically, nodules were evaluated as: "excellent" when absolutely no nodules occurred, "passable" when one to 5 nodules occurred per 0.01 $m^2$ area, and "bad" when six or more nodules occurred per 0.01 $m^2$ area.

Example 1 a) Fabrication of a Sputtering Target

[Grinding Process]

In order to fabricate target material segments (13a to 13f), six cylindrical ITO (indium oxide that includes tin) sintered bodies having an outer diameter of 155 mm, inner diameter of 131 mm, and overall length (length in the axial direction) of 165 mm were prepared, and the processing described below was performed for each sintered body.

First, the cylindrical ITO sintered bodies were placed on a flat surface grinder, and grinding was performed two times on both end surfaces using a grindstone having a grade of #120 so that the overall length became 161 mm. Next, the cylindrical ITO sintered bodies were placed on a cylindrical grinder, and in order to make the outer diameter 151 mm, rough grinding of the outer-circumferential surfaces (sputtering surfaces) was performed two times using a grindstone having a grade of #120, a cutting amount of $\phi$0.1 mm/sec and a grinding time at one location of 18 seconds until the outer diameter became 151.4 mm, then finish grinding was performed two times using a grindstone having a grade of #170, a cutting amount of $\phi$0.08 mm/sec and a grinding time at one location of 2.5 seconds, and zero grinding (spark out) was performed four times using a grindstone having a grade of #170. After that, the cylindrical ITO sintered bodies were placed on an internal grinder and grinding of the inner-circumferential surfaces was performed using a grindstone having a grade of #120 so that the inner diameters became 135 mm. Finally, the cylindrical ITO sintered bodies were placed again on a flat surface grinder and both end surfaces were ground 0.5 mm each using a grindstone having a grade of #120 so that the overall length became 160 mm.

The arithmetic mean roughness Ra, maximum height Rz and 10-point mean roughness $Rz_{JIS}$ of the sputtering surfaces (15) of the target material segments (13a to 13f) that were obtained in this way were measured using a surface roughness and contour shape measuring device according to a method that complies to JIS B 0601 (2013). These results are given in Table 2. The surface roughness of the end surfaces (16) of these target material segments (13a, to 13f) was similarly measured and the arithmetic mean roughness Ra was found to be 1.1 µm, the maximum height Rz was found to be 7.8 µm, and the 10-point mean roughness $Rz_{JIS}$ was found to be 7.8 µm.

[Bonding Process]

Masking tape was applied to the sputtering surfaces (15) and the end surfaces (16) of the target material segments (13a to 13f) that were obtained during the grinding process, after which an ultrasonic soldering iron was used to apply an indium solder to the inner-circumferential surfaces of the target material segments (13a to 13f).

Next, a backing tube (12) having an overall length of 1 m was made to stand erect, the target material segment (13a) was placed onto the backing tube (12), and the target material segment (13a) and the backing tube (12) were heated. When the temperature of the target material segment (13a) and the backing tube (12) exceeded 160° C., a fixed amount of melted indium solder was injected into the space between the target material segment (13a) and the backing tube (12). This indium solder was the same as the solder that was applied to the inner-circumferential surface of the target material segment (13a). In this state, the target material segment (13a) and the backing tube (12) were gradually cooled to room temperature, and after confirming that the indium solder was solidified and a bonding layer (14) was formed, the masking tape was peeled from the end surface (16).

Next, a ring-shaped teflon sheet having a thickness of 0.5 mm, and outer diameter of 153 mm and an inner diameter of 135 mm was placed onto the backing tube (12) and after being brought into close contact with the end surface (16) of the target material segment (13a), the target material segment (13b) was placed onto the backing tube (12) and the end surface (16) of the target material segment (13b) was brought into contact with the ring-shaped teflon sheet. As in the case of the target material segment (13a), the target material segment (13b) and the backing tube (12) were heated, and when the temperature of the target material segment (13b) and the backing tube (12) exceeded 160° C., a fixed amount of melted indium solder was injected. In this state, the target material segment (13b) and the backing tube (12) were gradually cooled to room temperature, and after confirming that the indium solder had solidified, the masking tape was peeled from the end surface (16).

After this, this same work was repeated and the target material segments (13c to 13f) were bonded to the backing tube (12). Then, by removing the ring-shaped teflon sheets that were place between the target material segments (13a to 13f), a cylindrical sputtering target (11) having a sputtering surface with an overall length of approximately 962 mm and composed of a cylindrical target material (13) that included target material segments (13a to 13f) was obtained. The maximum value and minimum value of the segment spacing of the adjacent target material segments (13a to 13f) of the cylindrical target material (13) are given in Table 2.

b) Sputtering Target Evaluation

The cylindrical sputtering target (11) that was obtained in this way was attached to a magnetron type rotating cathode sputtering apparatus, and sputtering was performed in a 0.7 Pa argon atmosphere at a power density of 15 kW/m, and after three hours of discharge, sputtering was stopped. In this initial sputtering period, arcing did not occur. Moreover, as a result of visual observation of the state of the sputtering surfaces (15) and the end surfaces (16), it was confirmed that nodules did not occur on any of the surfaces.

Sputtering was restarted, and when the thickness of the cylindrical target material (13) became 5 mm, sputtering was stopped again. In this intermediate sputtering period arcing did not occur. Similarly, as a result of visual observation of the state of the sputtering surfaces (15) and the end surfaces (16), it was confirmed that nodules did not occur on any of the surfaces.

Sputtering was then restarted and sputtering was performed until the life end. In this final sputtering period, arcing did not occur. Moreover, similarly, as a result of visually observing the state of the sputtering surfaces (15) and the end surfaces (16), it was confirmed that no nodules occurred in any of the surfaces. The results are given in Table 2.

(Sample 2)

Except for performing rough grinding of the outer-circumferential surfaces of the cylindrical ITO sintered bodies four times using a grindstone having a grade of #100, and performing finish grinding four times and performing zero grinding six times using a grindstone having a grade of #140, target material segments (13a to 13f) were obtained and a cylindrical sputtering target (11) was fabricated in the same way as in Example 1. As in Example 1, the target material segments (13a to 13f) of the cylindrical target material (13) were evaluated by measuring the surface roughness of the sputtering surfaces (15) of the target material segments (13a to 13f), the measuring the segment spacing of the target material segments (13a to 13f), and performing sputtering using the cylindrical sputtering target (11).

Example 3

Except for performing rough grinding of the outer-circumferential surfaces of the cylindrical ITO sintered bodies two times using a grindstone having a grade of #170, and performing finish grinding one time and performing zero grinding two times using a grindstone having a grade of #400, target material segments (13a to 13f) and a cylindrical sputtering target (11) were obtained in the same way as in Example 1. The target material segments (13a to 13f) and cylindrical sputtering target (11) were measured and evaluated in the same way as in Example 1.

Example 4

Except for performing rough grinding of the outer-circumferential surfaces of cylindrical TZO (tin oxide that includes zinc oxide (ZnO)) sintered bodies two times using a grindstone having a grade of #170, and performing finish grinding two times and performing zero grinding three times using a grindstone having a grade of #220, target material segments (13a to 13f) and a cylindrical sputtering target (11) were obtained in the same way as in Example 1. The target material segments (13a to 13f) and cylindrical sputtering target (11) were measured and evaluated in the same way as in Example 1.

Example 5

Except for performing rough grinding of the outer-circumferential surfaces of cylindrical ITO sintered bodies two times using a grindstone having a grade of #140, and performing finish grinding three times and performing zero grinding two times using a grindstone having a grade of #325, target material segments (13a to 13f) and a cylindrical sputtering target (11) were obtained in the same way as in Example 1. The target material segments (13a to 13f) and cylindrical sputtering target (11) were measured and evaluated in the same way as in Example 1.

Example 6

Except for performing rough grinding of the outer-circumferential surfaces of cylindrical ITO sintered bodies four times and performing zero grinding four times using a grindstone having a grade of #140, and omitting finish grinding, target material segments (13a to 13f) and a cylindrical sputtering target (11) were obtained in the same way as in Example 1. The target material segments (13a to 13f) and cylindrical sputtering target (11) were measured and evaluated in the same way as in Example 1.

Example 7 a) Fabrication of a Sputtering Target
[Grinding Process]

In order to fabricate target material segments (3a to 3f), six flat plate-shaped ITO sintered bodies having a length of 310 mm, width of 260 mm and thickness of 11 mm were prepared, and the processing described below was performed for each sintered body.

First, rough grinding was performed two times on the top surfaces (sputtering surfaces) of these flat plate-shaped ITO sintered bodies using a grindstone having a grade of #120 and a cutting amount of 15 μm, with cutting performed 30 times per one location so that the thickness of the flat plate-shaped target became 10.1 mm, then finish grinding was performed two times using a grindstone having a grade of #170 and cutting amount of 5 μm, with 10 cuttings performed per one location, and zero grinding was performed four times using a grindstone having a grade of #170 to make the target thickness 10 mm. After that, the flat plate-shaped ITO sintered bodies were processed using a slicing machine or grinding center so that the length became 300 mm and the width became 250 mm.

As in Example 1, the arithmetic mean roughness Ra, the maximum height Rz and the 10-point mean roughness $Rz_{JIS}$ of the sputtering surfaces (5) of the target material segments (3a to 3f) that were obtained in this way were measured. The results are given in Table 2. Similarly, the surface roughness of the side surfaces (6) of these target material segments (3a to 3f) were measured, and the arithmetic mean average Ra was 1.1 μm, the maximum height Rz was 7.8 μm, and the 10-point mean roughness was 6.2 μm.

[Bonding Process]

A flat plate-shaped sputtering target (1) that included a flat plate-shaped target material (3) that was composed of the target material segments (3a to 3f) and that had a length in the lengthwise direction of 1800 mm was obtained by bonding the target material segments (3a to 3f) that were obtained in the grinding process to a backing plate (2) using indium solder as a bonding material that formed a bonding layer (4) after solidification. The maximum value and minimum value of the segment spacing of adjacent target material segments (3a to 3f) of the flat plate-shaped target material (3) are given in Table 2.

b) Sputtering Target Evaluation

The flat plate-shaped sputtering target (1) that was obtained in this way was attached to a magnetron type rotating cathode sputtering apparatus, and sputtering was performed in a 0.7 Pa argon atmosphere and at a power density of 3 kW/cm², and after three hours of discharge, sputtering was stopped. In this initial sputtering period, arcing did not occur. Moreover, as a result of visual observation of the state of the sputtering surfaces (5) and the side surfaces (6), it was confirmed that nodules did not occur on any of the surfaces.

After that, sputtering was restarted, and when the thickness of the flat plate-shaped target material (3) became 5 mm, sputtering was stopped again. In this intermediate sputtering period, arcing did not occur. Similarly, as a result of visual observation of the state of the sputtering surfaces (5) and the side surfaces (6), it was confirmed that nodules did not occur on any of the surfaces.

Sputtering was restarted again and sputtering was performed until the life end. In this final sputtering period, arcing did not occur. Moreover, similarly, as a result of visually observing the state of the sputtering surfaces (5) and the side surfaces (6), it was confirmed that no nodules occurred in any of the surfaces. The results are given in Table 2.

Comparative Example 1

Except for performing rough grinding of the outer-circumferential surfaces of the cylindrical ITO sintered bodies four times using a grindstone having a grade of #80, and performing finish grinding four times and performing zero grinding four times using a grindstone having a grade of #100, target material segments (13a to 13f) and a cylindrical sputtering target (11) were obtained in the same way as in Example 1. The target material segments (13a to 13f) and cylindrical sputtering target (11) were measured and evaluated in the same way as in Example 1.

In Comparative Example 1, immediately after starting sputtering, arcing began to occur, so the power density was lowered to 5 kW/m and sputtering was continued, however, arcing could not be stopped. Therefore, when the thickness of the cylindrical target material (13) became 7.7 mm, sputtering was stopped. At this time, it was confirmed that nodules occurred on the sputtering surfaces (15) and the end surfaces (16), so sputtering was stopped at this stage. After that, the obtained film was also visually observed, and it was confirmed that defects had already occurred during film formation.

Comparative Example 2

Except for performing rough grinding of the outer-circumferential surfaces of the cylindrical ITO sintered bodies two times using a grindstone having a grade of #325, and performing finish grinding two times and performing zero grinding two times using a grindstone having a grade of #500, target material segments (13a to 13f) and a cylindrical sputtering target (11) were obtained in the same way as in Example 1. The target material segments (13a to 13f) and cylindrical sputtering target (11) were measured and evaluated in the same way as in Example 1.

In Comparative Example 2, up until the thickness of the cylindrical target material (13) became 7 mm, arcing did not occur and nodules did not occur on any of the sputtering surfaces (15) or end surfaces (16). However, arcing gradually began to occur, and the speed of film formation decreased. Therefore, the power density was reduced to 10 kW/m, and further to 2 kW/m, and sputtering was continued, however, arcing could not be stopped, and sputtering was stopped when the thickness of the cylindrical target material (13) became 5 mm. At this time, it was confirmed that nodules occurred on the sputtering surfaces (15) and end surfaces (16), so sputtering was stopped at this stage. After that, the obtained film was also visually observed, and it was confirmed that defects had already occurred during film formation.

Comparative Example 3

Except for performing rough grinding of the outer-circumferential surfaces of the cylindrical ITO sintered bodies two times using a grindstone having a grade of #100, and performing finish grinding one time and performing zero grinding one time using a grindstone having a grade of #120, target material segments (13a to 13f) and a cylindrical sputtering target (11) were obtained in the same way as in Example 1. The target material segments (13a to 13f) and cylindrical sputtering target (11) were measured and evaluated in the same way as in Example 1.

In Comparative Example 3, immediately after starting sputtering, arcing began to occur, so the power density was lowered to 4 kW/m and sputtering was continued, however, arcing could not be stopped. Therefore, when the thickness of the cylindrical target material (13) became 7.6 mm, sputtering was stopped. At this time, it was confirmed that nodules occurred on the sputtering surfaces (15) and the end surfaces (16). After that, sputtering was restarted, however, arcing could not be stopped, so finally, when the thickness of the cylindrical target material (13) became 7.3 mm, sputtering was stopped. At this time, as a result of visually observing the state of the sputtering surfaces (15) and end surfaces (16), it was confirmed that a large amount of nodules occurred on all of the surfaces.

Comparative Example 4

Except for performing grinding of the outer-circumferential surfaces of the cylindrical ITO sintered bodies by sequentially performing rough grinding one time, performing finish grinding and performing zero grinding one time using a grindstone having a grade of #140, target material segments (13a to 13f) and a cylindrical sputtering target (11) were obtained in the same way as in Example 1. The target material segments (13a to 13f) and cylindrical sputtering target (11) were measured and evaluated in the same way as in Example 1.

In Comparative Example 4, arcing began to occur immediately after sputtering started, however, did not occur at a frequency requiring that sputtering be stopped. However, arcing gradually became larger and the film formation speed decreased. After that, the power density was reduced to 4 kW/m and sputtering was continued, however, arcing could not be stopped, so sputtering was discontinued. At this time, as a result of visual observation of the state of the sputtering surfaces (15) and the end surfaces (16), it was confirmed that nodules had occurred on all of the surfaces, so sputtering was stopped at this stage.

Comparative Example 5

Except for performing rough grinding of the outer-circumferential surfaces of the cylindrical ITO sintered bodies two times using a grindstone having a grade of #140, performing finish grinding one time using a grindstone having a grade of #170 and omitting zero grinding, target material segments (13a to 13f) and a cylindrical sputtering target (11) were obtained in the same way as in Example 1. The target material segments (13a to 13f) and cylindrical sputtering target (11) were measured and evaluated in the same way as in Example 1.

In Comparative Example 5, arcing began to occur immediately after sputtering started, however, did not occur at a frequency requiring that sputtering be stopped. However, arcing gradually became larger and the film formation speed decreased. After that, the power density was reduced to 4 kW/m and sputtering was continued, however, arcing could not be stopped, so sputtering was discontinued. At this time, as a result of visual observation of the state of the sputtering surfaces (15) and the end surfaces (16), it was confirmed that nodules had occurred on all of the surfaces, so sputtering was stopped at this stage.

Comparative Example 6

Except for performing rough grinding of the top surfaces of the flat plate-shaped ITO sintered bodies two times using a grindstone having a grade of #80, and performing finish grinding five times and performing zero finishing two time using a grindstone having a grade of #500, target material segments (3a to 3f) and a flat plate-shaped sputtering target (1) were obtained in the same way as in Example 7. The target material segments (3a to 3f) and flat plate-shaped sputtering target (1) were measured and evaluated in the same way as in Example 7.

In Comparative Example 6, even though arcing did not occur immediately after sputtering started, arcing started to gradually occur. After three hours of discharge, sputtering was stopped, and the state of the sputtering surfaces (5) and side surfaces (6) was visually observed, and as a result, it was confirmed that there was no occurrence of nodules on any of the surfaces. After that, sputtering was restarted, however arcing could not be stopped, so when the thickness of the flat plate-shaped target material (3) became 9.5 mm, sputtering was stopped again. At this time, the sputtering surfaces (5) and the side surfaces (6) were visually observed, and as a result, it was confirmed that nodules had occurred on all of the surfaces. Sputtering was restarted again, however, arcing could not be stopped, so sputtering was stopped. At this time, as a result of visual observation of the state of the sputtering surfaces (5) and side surfaces (6), it was confirmed that a large amount of nodules had occurred on all of the surfaces.

TABLE 1

|  | Shape | Rough Grinding | | Finish Grinding | | Zero Grinding | |
| --- | --- | --- | --- | --- | --- | --- | --- |
|  |  | Grade | Number of Grindings | Grade | Number of Grindings | Grade | Number of Grindings |
| Example 1 | Cylindrical | #120 | 2 | #170 | 2 | #170 | 4 |
| Example 2 | Cylindrical | #100 | 4 | #140 | 4 | #140 | 6 |
| Example 3 | Cylindrical | #170 | 2 | #400 | 1 | #400 | 2 |
| Example 4 | Cylindrical | #170 | 2 | #220 | 2 | #220 | 3 |
| Example 5 | Cylindrical | #140 | 2 | #325 | 3 | #325 | 2 |
| Example 6 | Cylindrical | #140 | 4 | — | — | #140 | 4 |
| Example 7 | Flat Plate-shaped | #120 | 2 | #170 | 2 | #170 | 4 |
| Comparative Example 1 | Cylindrical | #80 | 4 | #100 | 4 | #100 | 4 |

TABLE 1-continued

|  | Shape | Rough Grinding | | Finish Grinding | | Zero Grinding | |
|---|---|---|---|---|---|---|---|
|  |  | Grade | Number of Grindings | Grade | Number of Grindings | Grade | Number of Grindings |
| Comparative Example 2 | Cylindrical | #325 | 2 | #500 | 2 | #500 | 2 |
| Comparative Example 3 | Cylindrical | #100 | 2 | #120 | 1 | #120 | 1 |
| Comparative Example 4 | Cylindrical | #140 | 1 | #140 | 1 | #140 | 1 |
| Comparative Example 5 | Cylindrical | #140 | 1 | #170 | 1 | — | — |
| Comparative Example 6 | Flat Plate-shaped | #80 | 2 | #500 | 5 | #500 | 2 |

TABLE 2

|  | Surface Roughness of Sputtering Surface (µm) | | | | | | Segment Spacing (mm) | | Arcing Evaluation | | | Nodule Evaluation |
|---|---|---|---|---|---|---|---|---|---|---|---|---|
|  | Ra | | Rz | | Rz$_{JIS}$ | | | | Initial period | Intermediate period | Final period | |
|  | min | max | min | max | min | max | min | max | | | | |
| Example 1 | 1.08 | 1.18 | 7.7 | 7.96 | 6.0 | 6.3 | 0.2 | 0.6 | Excellent | Excellent | Excellent | Excellent |
| Example 2 | 1.33 | 1.46 | 8.5 | 8.83 | 6.76 | 6.91 | 0.5 | 0.9 | Good | Excellent | Excellent | Excellent |
| Example 3 | 0.96 | 0.99 | 6.1 | 6.3 | 4.98 | 5.02 | 0.2 | 0.9 | Excellent | Excellent | Excellent | Excellent |
| Example 4 | 0.9 | 0.94 | 5.6 | 5.8 | 4.1 | 4.4 | 0.4 | 0.5 | Excellent | Excellent | Good | Excellent |
| Example 5 | 1.0 | 1.2 | 6.7 | 6.9 | 5.28 | 5.41 | 0.2 | 0.5 | Excellent | Excellent | Excellent | Excellent |
| Example 6 | 1.44 | 1.48 | 9.54 | 9.81 | 6.6 | 6.79 | 0.2 | 0.3 | Good | Excellent | Excellent | Excellent |
| Example 7 | 1.02 | 1.17 | 7.7 | 7.91 | 6.0 | 6.4 | 0.3 | 0.4 | Excellent | Excellent | Excellent | Excellent |
| Comparative Example 1 | 1.71 | 1.83 | 11.13 | 11.56 | 7.51 | 7.77 | 0.2 | 0.5 | Bad | — | — | Bad |
| Comparative Example 2 | 0.7 | 0.88 | 4.7 | 4.88 | 3.33 | 3.87 | 0.2 | 0.9 | Excellent | Passable | — | Passable |
| Comparative Example 3 | 1.56 | 1.61 | 10.08 | 10.2 | 7.18 | 7.32 | 0.3 | 0.5 | Bad | — | — | Bad |
| Comparative Example 4 | 1.36 | 1.46 | 10.03 | 10.15 | 6.72 | 6.94 | 0.2 | 0.4 | Passable | — | — | Bad |
| Comparative Example 5 | 1.33 | 1.45 | 8.8 | 9.3 | 7.05 | 7.3 | 0.3 | 0.4 | Passable | — | — | Bad |
| Comparative Example 6 | 0.55 | 0.66 | 4.55 | 4.69 | 3.36 | 3.8 | 0.2 | 0.3 | Excellent | Bad | — | Bad |

EXPLANATION OF REFERENCE NUMBERS

1 Flat plate-shaped sputtering target
2 Backing body (backing plate)
3 Flat plate-shaped target material
3a to 3f Target material segment
4 Bonding layer
5 Sputtering surface
6 Side surface
11 Cylindrical sputtering target
12 Backing body (backing tube)
13 Cylindrical target material
13a to 13f Target material segment
14 Bonding layer
15 Sputtering surface
16 End surface

What is claimed is:

1. A target material for sputtering composed of an oxide sintered body and having a sputtering surface, wherein the surface roughness of the sputtering surface has an arithmetic mean roughness Ra within the range of 0.9 µm to 1.5 µm, a maximum height Rz of within the range of 5.0 µm to 10.0 µm, and a 10-point mean roughness Rz$_{JIS}$ of within the range of 4.0 µm to 7.0 µm.

2. A manufacturing method for a target material for sputtering, comprising a processing process of obtaining a target material for sputtering by processing a material that is composed of an oxide sintered body; wherein in the processing process, rough grinding using a grindstone having a specified grade is performed on a surface of the target material for sputtering of the material that will become the sputtering surface, after which zero grinding is performed so that the surface roughness of the sputtering surface has an arithmetic mean roughness Ra within the range of 0.9 µm to 1.5 µm, a maximum height Rz within the range of 5.0 µm to 10.0 µm, and a 10-point mean roughness Rz$_{JIS}$ within the range of 4.0 µm to 7.0 µm.

3. The manufacturing method for a target material for sputtering according to claim 2, wherein the rough grinding is performed using a grindstone having a grade within the range #100 to #170, and the zero grinding is performed using a grindstone having a grade within the range #140 to #400.

4. The manufacturing method for a target material for sputtering according to claim 2, wherein the rough grinding is performed by dividing rough grinding into two to four grindings.

5. The manufacturing method for a target material for sputtering according to claim 2, wherein the zero grinding is performed by dividing zero grinding into two to six grindings.

6. The manufacturing method for a target material for sputtering according to claim 2, wherein after the rough grinding and before the zero grinding, a finish grinding that is divided into one to four grindings is performed using a grindstone having a grade within the range #140 to #400.

7. A sputtering target comprising a backing body, and a target material for sputtering that is bonded to the backing body by way of a bonding layer, wherein the target material for sputtering is the target material for sputtering of claim 1.

8. The sputtering target according to claim 7, wherein the target material for sputtering comprises plural target material segments.

9. The sputtering target according to claim 7, wherein the backing body comprises a cylindrical backing tube, and the target material for sputtering has a cylindrical shape.

10. A manufacturing method for a sputtering target that comprises plural target material segments that are arranged adjacent to each other, wherein the target material for sputtering according to claim 1 is used for each of the plural target material segments; the manufacturing method comprising a bonding process of bonding the plural target material segments to a backing body so that spacing between end surfaces of adjacent target material segments that face each other is no less than 0.1 mm and no greater than 1.0 mm.

11. The sputtering target according to claim 8, wherein the plural target material segments have end surfaces between adjacent target material segments thereof, and the end surfaces are constructed by the non-sputtering surface.

\* \* \* \* \*